US012575389B2

(12) United States Patent
Dou

(10) Patent No.: US 12,575,389 B2
(45) Date of Patent: Mar. 10, 2026

(54) METHOD FOR FABRICATING SEMICONDUCTOR STRUCTURES

(71) Applicant: ChangXin Memory Technologies, Inc., Hefei (CN)

(72) Inventor: Tao Dou, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 396 days.

(21) Appl. No.: 18/547,151

(22) PCT Filed: Apr. 20, 2023

(86) PCT No.: PCT/CN2023/089535
§ 371 (c)(1),
(2) Date: Aug. 18, 2023

(87) PCT Pub. No.: WO2024/011985
PCT Pub. Date: Jan. 18, 2024

(65) Prior Publication Data
US 2024/0172410 A1 May 23, 2024

(30) Foreign Application Priority Data

Jul. 12, 2022 (CN) .......................... 202210822648.1

(51) Int. Cl.
*H10B 12/00* (2023.01)
*H01L 21/762* (2006.01)
(52) U.S. Cl.
CPC ...... *H01L 21/76224* (2013.01); *H10B 12/488* (2023.02)

(58) Field of Classification Search
CPC ...... H10B 12/488; H10B 12/50; H10B 12/03; H01L 21/76224
See application file for complete search history.

(56) References Cited

U.S. PATENT DOCUMENTS

2021/0313317 A1* 10/2021 Tsao .................. H10D 30/6735

FOREIGN PATENT DOCUMENTS

CN 112216318 A 1/2021

OTHER PUBLICATIONS

PCT/CN2023/089535 International Search Report mailed Jun. 14, 2023.

* cited by examiner

*Primary Examiner* — Reema Patel
(74) *Attorney, Agent, or Firm* — Syncoda LLC; Feng Ma

(57) ABSTRACT
A method of manufacturing a semiconductor structure is disclosed. The semiconductor structure includes a transistor area, which includes a first source-drain area and a word line region. The method includes forming an active layer on a substrate, and the active layer of the transistor region includes a plurality of active structures. A dummy word line structure covering the active structure of the same layer is formed in the first source drain region and the word line region. The first isolation layers arranged alternately with the dummy word line structures in the third direction are formed. Then the dummy word line structure is removed. An initial dielectric layer is formed on the surface of the active structure of the first source-drain region and the word line region. An initial word line is formed on the surface of the initial dielectric layer. The initial word line and the initial dielectric layer located in the first source and drain region are removed.

15 Claims, 27 Drawing Sheets

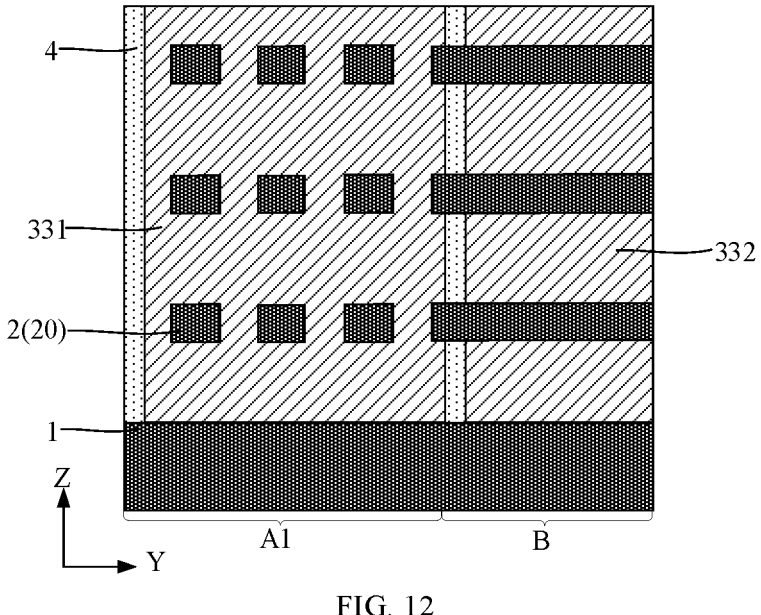
FIG. 12
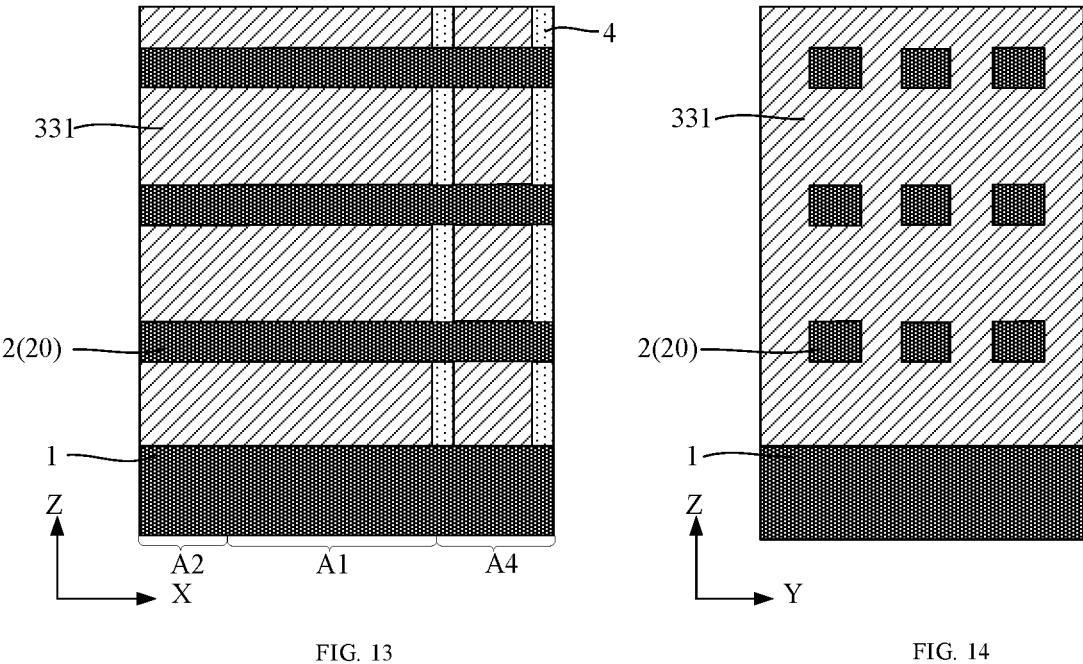
FIG. 13
FIG. 14

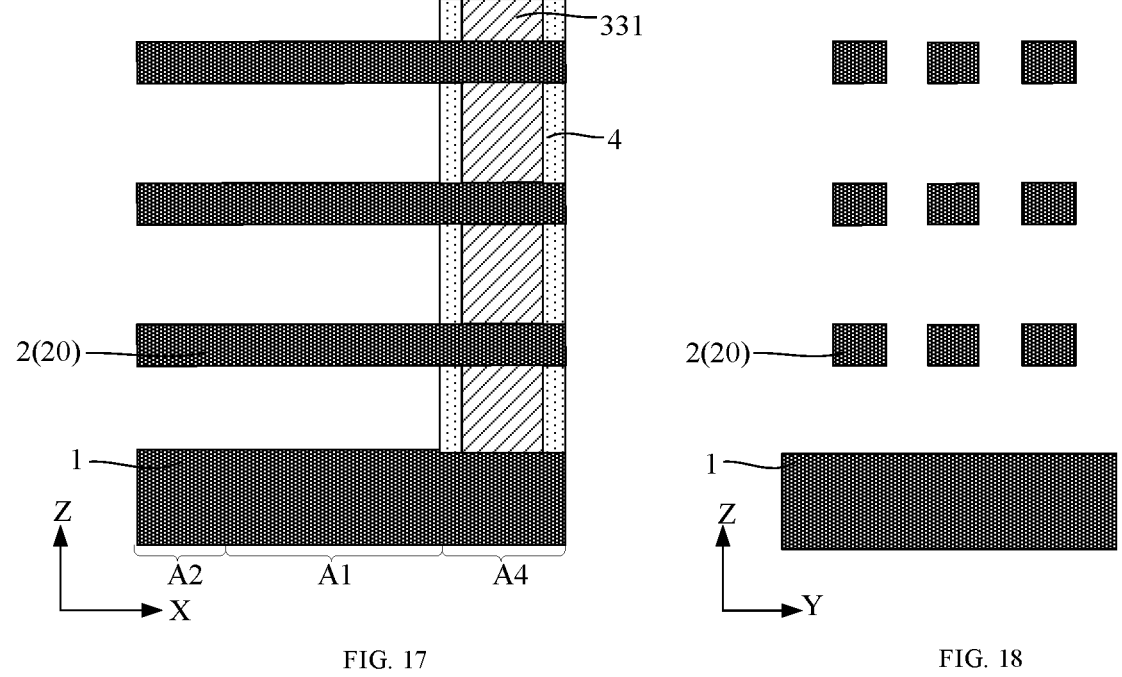
FIG. 17                  FIG. 18

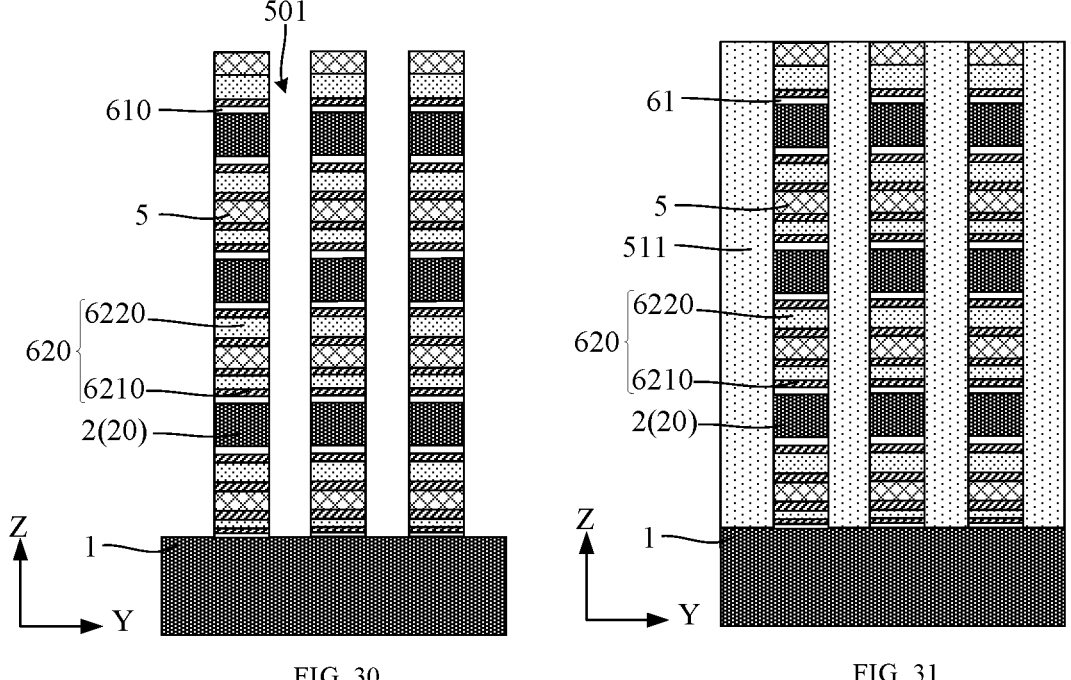
FIG. 30                                    FIG. 31

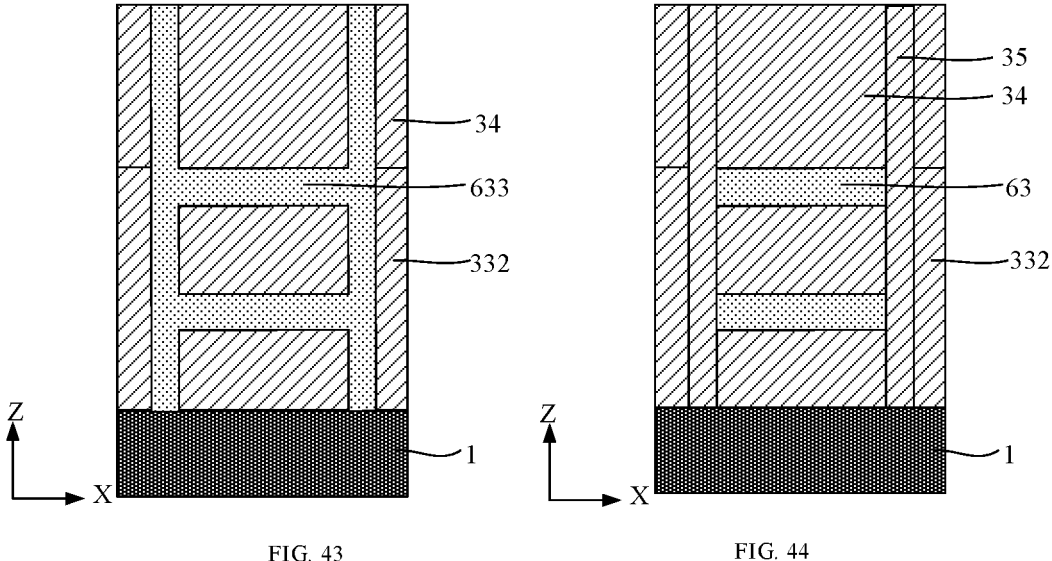
FIG. 43                              FIG. 44

METHOD FOR FABRICATING SEMICONDUCTOR STRUCTURES

CROSS REFERENCES TO RELATED APPLICATIONS

This application claims the benefit of priority of Chinese patent application with the application number 202210822648.1, entitled "Method For Fabricating Semiconductor Structures", filed on Jul. 12, 2022, the contents of which are incorporated herein by reference in its entirety.

TECHNICAL FIELD

The present disclosure is related to the field of semiconductors, and in particular relate to a method for manufacturing a semiconductor structure.

BACKGROUND

Dynamic Random Access Memory (DRAM) is a semiconductor memory, the principle of operation is to use the amount of charges stored in capacitors to represent binary bits stored as is 1 or 0.

The 3D stacked DRAM is a structure in which multiple layers of transistors are stacked on a substrate, and its integration level is relatively high, which is conducive to reducing the cost per unit area. However, the performance of 3D stacked DRAM still needs to be improved.

SUMMARY

Embodiments of the present disclosure provide a method for manufacturing a semiconductor structure, which is beneficial to improving the performance of a 3D stacked DRAM.

According to an embodiment of the present disclosure, a method for manufacturing a semiconductor structure is provided, wherein the semiconductor structure includes a transistor region, and the transistor region includes a first source and drain arranged in a first direction region and a word line region, the manufacturing method includes: providing a substrate, forming a multi-layer active layer arranged at intervals on the substrate, the active layer of the transistor region includes a plurality of active layers arranged in the second direction source structure, the second direction is perpendicular to the first direction; a plurality of dummy word line structures are formed in the first source drain region and the word line region, and the dummy word line structures cover the same layer of the surface of the active structure; a first isolation layer is formed between adjacent dummy word line structures to form a first isolation layer, and the first isolation layer and the dummy word line structure are arranged alternately in the third direction, so the third direction is perpendicular to the surface of the substrate; the dummy word line structure is removed; an initial dielectric layer is formed on the surface of the active structure in the first source and drain region and the word line region; an initial word line is formed on the surface of the dielectric layer, and the initial word line covers the active structure; the initial word line and the initial dielectric layer located in the first source and drain region are removed; the remaining initial dielectric layer constitutes Dielectric layer; the remaining initial word line constitutes a word line, and the word line covers the active structure of the same layer of the word line region; an insulating layer is formed in the first source and drain region, and the insulating layer A layer is located between adjacent active structures and covers the first isolation layer.

The technical solution provided by the embodiments of the present disclosure has at least the following advantages: a dummy word line structure covering the same layer of active layer is formed, and the space occupied by the dummy word line structure is the space occupied by the initial word line formed subsequently Position; a first isolation layer is formed between adjacent dummy word line structures, and thereafter, the dummy word line structures are removed and initial word lines are formed in the first isolation layer. That is, the first isolation layer can regulate the shape of the initial word lines, thereby avoiding the disconnection of the same word line or the interconnection of adjacent word lines. Furthermore, it is thereby advantageous to improve the performance of the semiconductor structure. In addition, the first source and drain regions can increase the process window for forming the dummy word line structure, the first isolation layer, and the initial word line, thereby facilitating process manufacturing.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Apparently, the drawings in the following description are only some embodiments of the present disclosure, and those skilled in the art can obtain other drawings according to these drawings without creative efforts.

FIG. 1 shows a schematic diagram of a semiconductor structure; and

FIGS. 2-46 show the structural diagrams at each of the steps during manufacturing the semiconductor structure.

DETAILED DESCRIPTION OF THE PREFERRED EMBODIMENTS

Figures 1, 2:
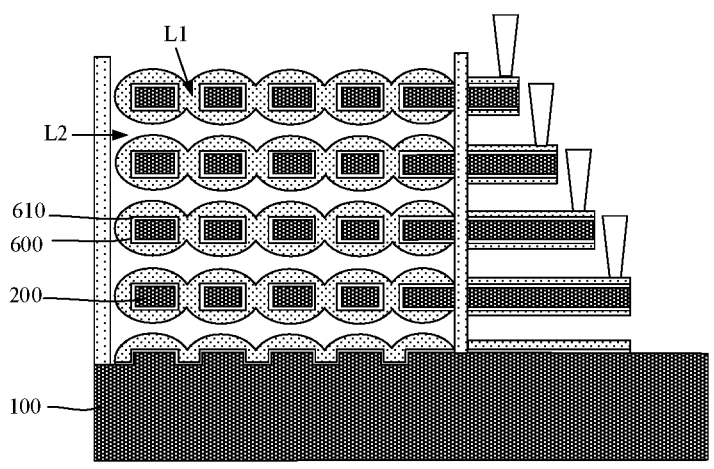

As known from the background art, the performance of 3D stacked DRAM still needs to be improved. Referring to FIG. 1, analysis shows that after the multilayer active structure 200 is formed on the substrate 100, conductive materials are usually directly deposited to form the word lines 600 covering the multiple active structures 200 of the same layer; however, conductive material is deposited at varying thicknesses at different locations, allowing false interconnections or disconnections to occur. For example, at the first location L1, that is, at the edge of the active structure 200, the thickness of the word line 600 is small, and disconnection may occur. In the second position L2, since the upper and lower spaces are connected, the upper and lower adjacent word lines 600 are easily interconnected. Therefore, the performance of the semiconductor structure needs to be improved.

One embodiment of the present disclosure provides a manufacturing method for a semiconductor structure, includes: forming a dummy word line structure covering the active structure of the same layer, and forming a first isolation layer between adjacent dummy word line structures, and thereafter, removing The dummy word line structure exposes the active structure to form a word line covering the same layer of active structure. That is, the spatial position occupied by the dummy word line structure is the spatial position occupied by the word line, and the first isolation layer is a mold for forming the word line, which can standardize the shape of the word line, thereby avoiding word lines between adjacent active structures. In addition, the first isolation layer has been formed before forming the word lines, and under the isolation effect of the first dielectric layer, the interconnection of the upper and lower word lines can be avoided. In addition, the first source and drain regions can also be used to increase the process window, thereby facilitating process manufacturing.

Various embodiments of the present disclosure will be described in detail below in conjunction with the accompanying drawings. However, those of ordinary skill in the art can understand that, in each embodiment of the present disclosure, many technical details are provided for readers to better understand the embodiments of the present disclosure. However, even without these technical details and various options and modifications based on the following embodiments, the technical solutions claimed in the embodiments of the present disclosure can be realized.

As shown in FIGS. 2-46, an embodiment of the present disclosure provides a method for manufacturing a semiconductor structure. The method for manufacturing the semiconductor structure provided by the embodiment will be described in detail below in conjunction with the accompanying drawings. It should be noted that, in order to facilitate description and clearly illustrate the steps of the semiconductor structure fabrication method, FIGS. 2 to 46 are partial structural diagrams at each of the steps during manufacturing the semiconductor structure.

With reference to FIG. 2, FIG. 2 shows a top view of the final semiconductor structure. For more intuitive view, only a part of the semiconductor structure is shown in the top view. First of all, it should be noted that there are a first direction X, a second direction Y and a third direction Z in the semiconductor structure (refer to FIG. 3). The first direction X and the second direction Y are perpendicular to each other and parallel to the surface of the substrate 1, and the third direction Z is perpendicular to the surface of the substrate 1.

The semiconductor structure includes a transistor region A, a first source-drain region A2 and a word line region A1 in which the transistor region A is sequentially arranged in a first direction X. In some embodiments, the semiconductor structure further includes a step region B, and the step region B and the word line region A1 are arranged in the second direction Y, and the two are connected.

Figure 3:
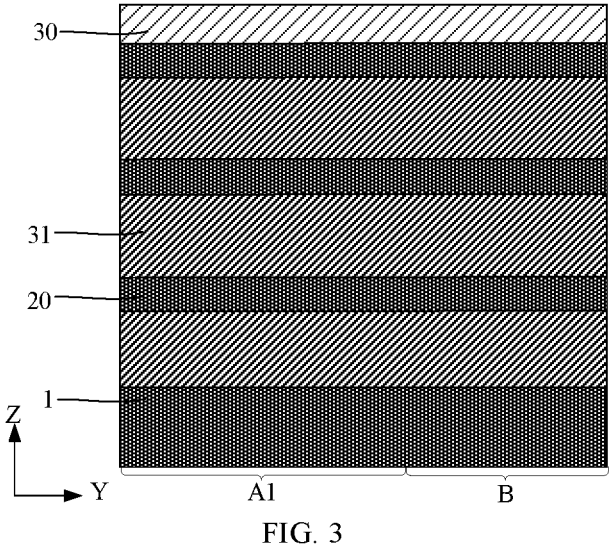
Figure 4:
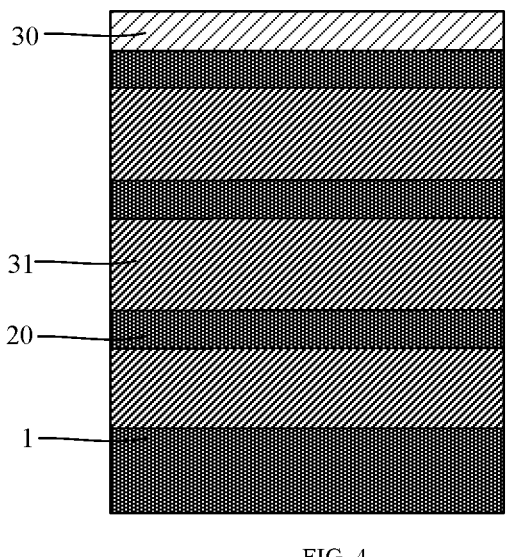
Figure 5:
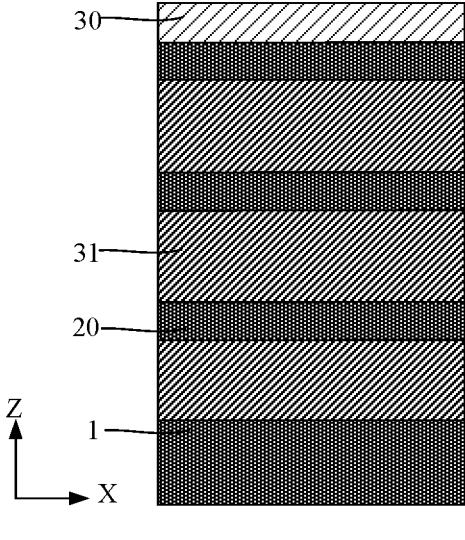

FIG. 3 is the cross sectional view on d-d1 direction shown in FIG. 2; FIG. 4 is the cross sectional view on e-e1 direction shown in FIG. 2, f-f1 direction and h-h1 direction; FIG. 5 is A cross-cross sectional view in the g-g1 direction shown in FIG. 2. Referring to FIGS. 3-5, a substrate 1 is provided, and multiple layers of active layers 20 and sacrificial layers 31 are formed on the substrate 1 alternately. In some embodiments, the active layer 20 and the sacrificial layer 31 are located on the substrate 1 in the transistor region A and the step region B.

Exemplarily, the active layer 20 and the sacrificial layer 31 are formed by an epitaxial growth process. In addition, the material of the active layer 20 and the substrate 1 can be the same, for example, both can be silicon layers. The material of the sacrificial layer 31 may be silicon germanium.

In addition, the protective layer 30 may also be formed on the surface of the active layer 20. For example, silicon oxide is deposited on the surface of the active layer 20 as the protection layer 30. The protection layer 30 can protect the surface of the active layer 20 during the subsequent etching process.

Figures 6, 7:
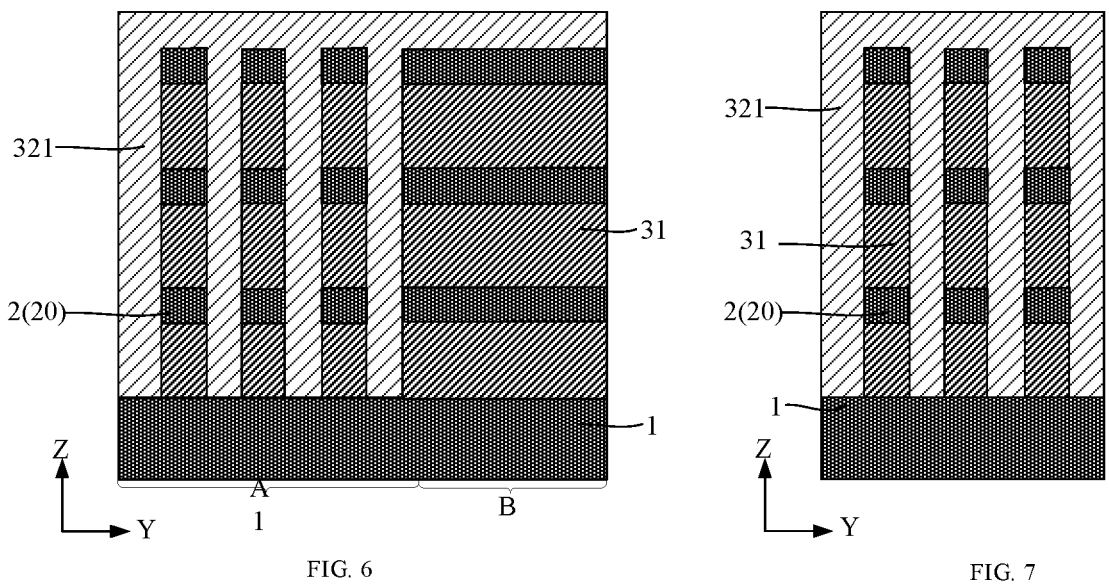

With reference to FIG. 6-FIG. 7, FIG. 6 is the cross sectional view on d-d1 direction shown in FIG. 2, and FIG. 7 is the cross sectional view on f-f1 direction shown in FIG. 2 and h-h1 direction, in In this step, the cross section of the semiconductor structure in the e-e1 direction remains unchanged, as shown in FIG. 4; a second isolation layer 321 is formed in the transistor region A, and the second isolation layer 321 penetrates the active layer 20 and the sacrificial layer 31, And the active layer 20 of the transistor region A is divided into a plurality of active structures 2.

Exemplarily, the active layer 20 and the sacrificial layer 31 are patterned to remove part of the active layer 20 and the sacrificial layer 31 to form a plurality of grooves extending in the first direction X; an insulating material is deposited in the groove as the second isolation layer 321. The material of the second isolation layer 321 may be the same as that of the protection layer 30, for example, both are silicon oxide.

Figures 8, 9:
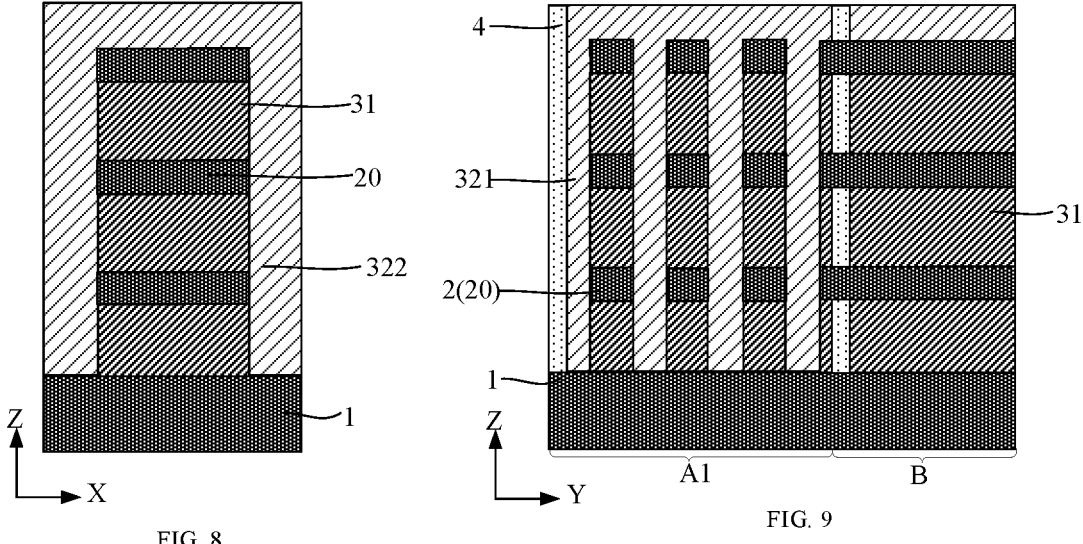

In some embodiments, the edge isolation layer 322 can also be formed in the step region B while the second isolation layer 321 is formed. Specifically, referring to FIG. 2 and FIG. 8, FIG. 8 is a cross-cross sectional view in the g-g1 direction shown in FIG. 2. Directly opposite, and part of the side of the first region B1 is in contact with the word line region A1, the second region B2 surrounds the side of the first region B1 that is not in contact with the word line region A1, and the second region B2 can be used to increase the size of the first region B1—process window for zone B1. For example, the shape of the first region B1 is a rectangle, one side of the first region B1 is in contact with the word line region A1, and the second region B2 surrounds the other three sides of the first region B1. The edge isolation layer 322 is located in the second region B2 of the stepped area B.

Exemplarily, the sacrificial layer 31 and the active layer 20 located in the second region B2 are removed, and thereafter, the edge isolation layer 322 is deposited in the second region B2.

Figure 10:
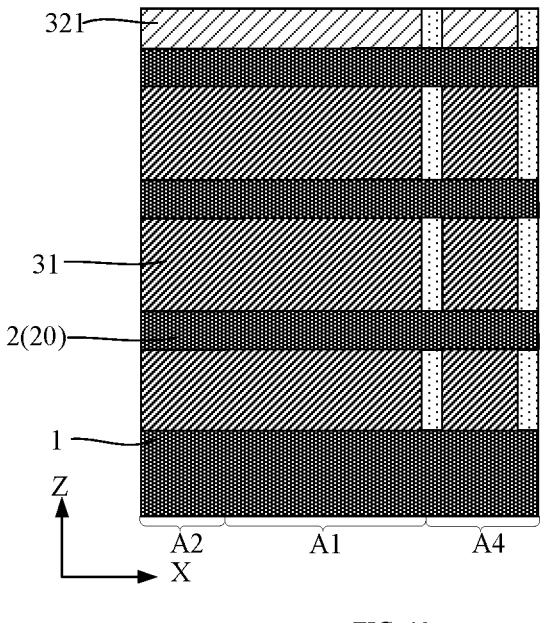
Figure 11:
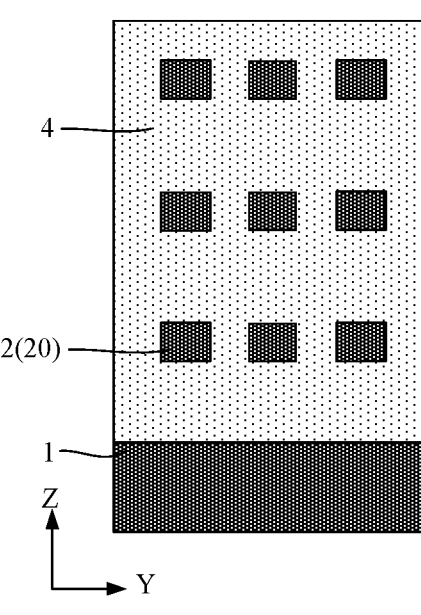

FIG. 9 is the cross sectional view on the d-d1 direction shown in FIG. 2, and FIG. 10 is the cross sectional view in the e-e1 direction shown in FIG. 2, and FIG. 11 is the h-h1 direction shown in FIG. 2's cross sectional view; referring to FIGS. 9-11, a supporting structure 4 is formed. For example, a dry etching process is used to remove part of the second isolation layer 321 and part of the sacrificial layer 31 to form a plurality of trenches, and silicon nitride is deposited in the trenches as the support structure 4. After silicon nitride is deposited, planarization is performed using a chemical mechanical polishing process.

Referring to FIG. 9, in some embodiments, the support structure 4 is located on the side of the word line region A1 away from the step region B, and the support structure 4 penetrates the second isolation layer 321, and the support structure 4 can be used to define the word line region A1 is away from the boundary of the step region B. The support structure 4 can also be located on the side of the step region B facing the word line region A1, and the support structure 4 can be used to support the active layer 20 of the step region B.

Referring to FIGS. 10-11, in other embodiments, the support structure 4 is at least located on the side of the word line region A1 facing away from the first source and drain region A2, and the support structure 4 here covers the active structure 2. That is, the support structure 4 here is a mesh structure, and the active structure 2 penetrates the support structure 4. In addition, the support structure 4 can also be located on a side of the anti-leakage region A4 away from the word line region A1, and the support structure 4 here covers the active structure 2.

In some other embodiments, with reference to FIG. 2, while forming support structure 4, also can form frame structure 42 around step region B, frame structure 42 penetrates edge isolation layer 322 (refer to FIG. 8), and At the junction of the word line region A1 and the first region B1, the frame structure 42 also covers the active layer 20. That is, the frame structure 42 is used to define the edge of the step region B, and can isolate the step region B from other regions in the semiconductor structure. It should be noted that, the farther the distance between the frame structure 42 at the edge of the second region B2 and the first region B1 is, the larger the process window of the first region B1 is.

In some embodiments, referring to FIG. 2, in the first direction X, the width of the step region B is greater than the width of the word line region A1. Since the active layer 20 in the first region B1 will be removed later, the larger width of the step region B can increase the process window for removing the active layer 20, thereby facilitating the manufacturing process.

With reference to FIG. 12-FIG. 14, FIG. 12 is the cross sectional view on the d-d1 direction shown in FIG. 2, and FIG. 13 is the cross sectional view in the e-e1 direction shown in FIG. 2, and FIG. 14 is shown in FIG. 2. In this step, the cross-cross sectional view in the h-h1 direction remains unchanged, refer to FIG. 11, remove the second isolation layer 321 and the sacrificial layer 31 of the transistor region A to expose the active layer 20 of the transistor region. In addition, the edge isolation layer 322 and the sacrificial layer 31 of the step region B can be removed, that is, the edge isolation layer 322 of the second region B2 and the sacrificial layer 31 of the first region B1 can be removed to expose the active layer 20 of the step region B.

Exemplarily, a wet etching process is used to remove the second isolation layer 321, the sacrificial layer 31 and the edge isolation layer 322. The support structure 4 can support the active layer 20 when the above structures are removed.

Continue to refer to FIG. 12-FIG. 14, form first filling layer 331 in transistor region A, first filling layer 331 covers active layer 20 and support structure 4, promptly first filling layer 331 occupies transistor region A original space between the sacrificial layer 31 and the second isolation layer 321.

Figures 15, 16:
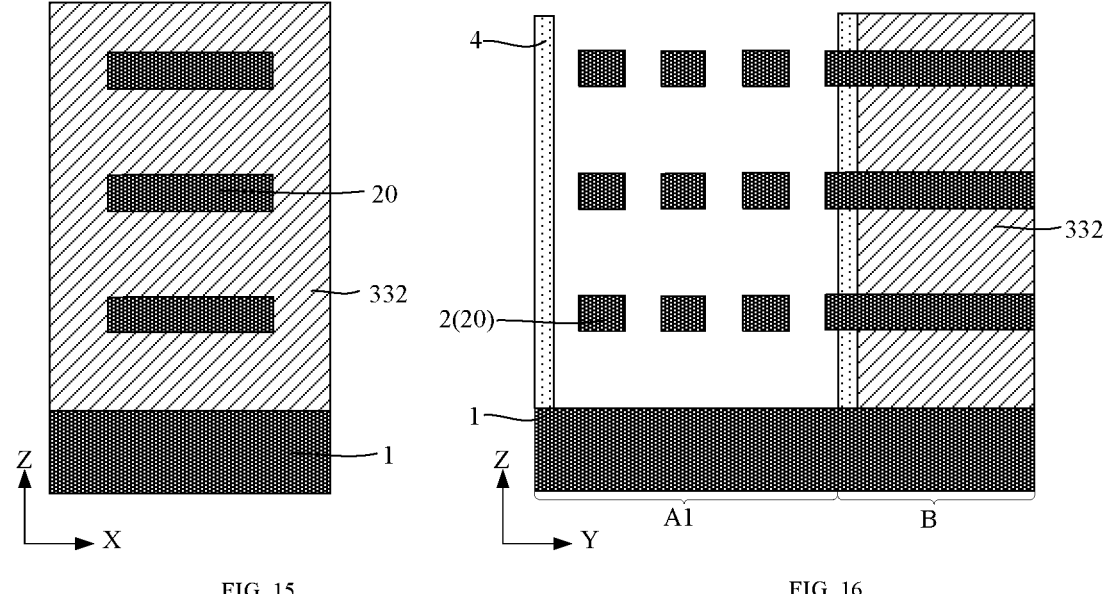

With reference to FIG. 15, FIG. 15 is the cross sectional view of g-g1 direction shown in FIG. 2, while forming first filling layer 331, can also form multi-layer second filling layer 332 in step region B, the second filling layers 332 are arranged alternately with the active layers 20. Specifically, the second filling layers 332 are arranged alternately with the active layers 20 in the first region B1, and the second filling layers 332 are also filled in the second region B2.

Exemplarily, a chemical vapor deposition process is used to fill the transistor region A and the step region B with silicon oxide as the first filling layer 331 and the second filling layer 332, and thereafter, a chemical mechanical polishing process is used for planarization.

With reference to FIG. 16-FIG. 18, FIG. 16 is the cross sectional view on the d-d1 direction shown in FIG. 2, and FIG. 17 is the cross sectional view in the e-e1 direction shown in FIG. 2, and FIG. 18 is shown in FIG. 2 In the cross-cross sectional view of the direction f-f1, the first filling layer 331 located in the first source-drain region A2 and the word line region A1 is removed, thereby exposing the active structure 2 of the first source-drain region A2 and the word line region A1.

It should be noted that the main reason for removing the first filling layer 331 of the first source and drain region A2 is that the first source and drain region A2 can be used to increase the process window of the word line region A1, so as to facilitate subsequent formation of dummy words line structure 6, first isolation layer 5, initial word line 620 and initial dielectric layer 610. The process window is enlarged, the production efficiency is improved, and it is beneficial to improve the quality of each film layer, thereby improving the performance of the semiconductor structure.

So far, based on FIG. 3-FIG. 18, can form the active layer 20 that multilayer is arranged at intervals on substrate 1, the active layer 20 of transistor area A comprises a plurality of active structures 2 arranged in second direction Y, and the active structure 2 in the word line region A1 and the first source and drain region A2 is exposed, so as to facilitate subsequent formation of a dummy word line structure 6. The above steps are for illustrative purposes only, and the embodiments of the present disclosure are not limited thereto. For example, after the support structure 4 is formed, only the second isolation layer 321 and the sacrificial layer 31 in the word line region A1 and the first source and drain region A2 may be removed. Since the sacrificial layer 31 in other regions is not removed, there is no need to form the first filling layer 331 and the second filling layer 332.

Figure 19:
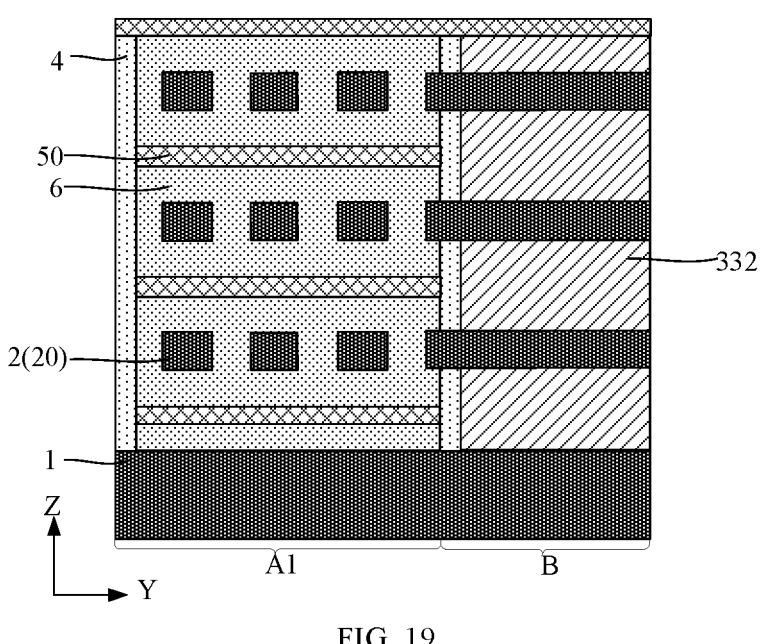
Figures 20, 21:
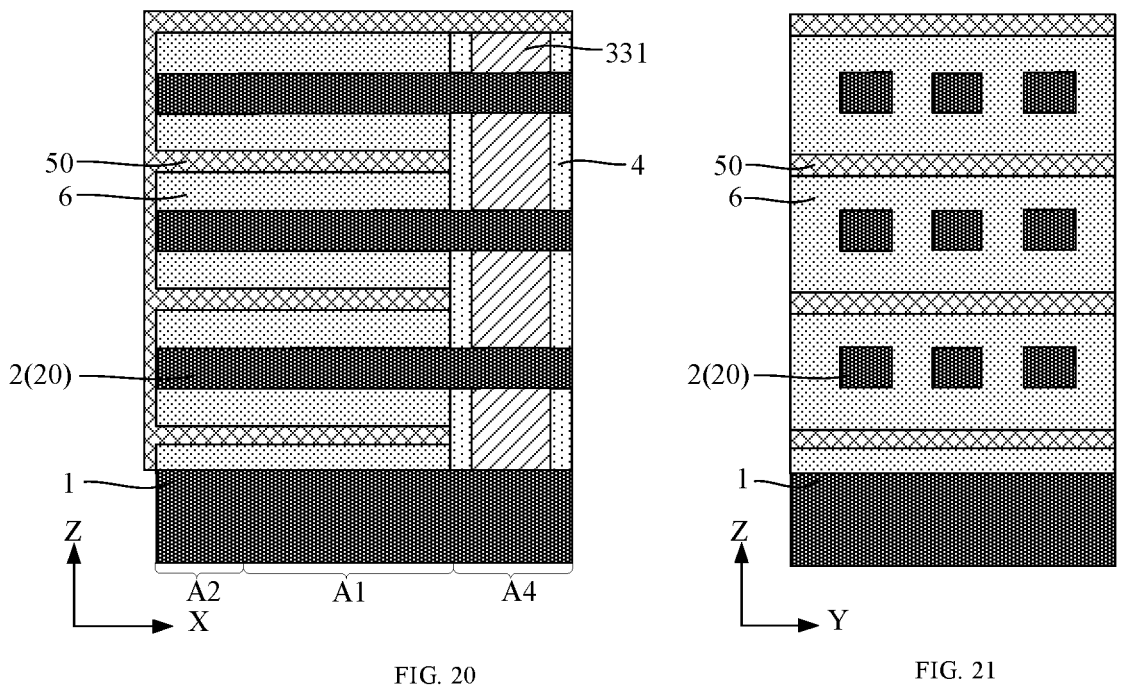

FIG. 19 is the cross sectional view on the d-d1 direction shown in FIG. 2, and FIG. 20 is the cross sectional view in the e-e1 direction shown in FIG. 2, and FIG. 21 is the cross sectional view in the f-f1 direction shown in FIG. 2 19-21, a plurality of dummy word line structures 6 are formed in the first source and drain region A2 and the word line region A1, and the dummy word line structures 6 cover the surface of the active structure 2 in the same layer.

Exemplarily, silicon oxide is deposited on the surface of the active layer 20 as the dummy word line structure 6 by an atomic layer deposition process. The atomic layer deposition process coats the material layer by layer in the form of a single atomic film on the surface of the active structure 2. During the atomic layer deposition process, the chemical reaction of the new layer of atomic film is directly related to the previous layer, so, the uniformity and density of the film layer are better, which is beneficial to improving the morphology of the dummy word line structure 6. The spatial position of the dummy word line structure 6 is the spatial position of the subsequently formed word line 62, therefore, the morphology of the subsequently formed word line 62 can also be improved. In other embodiments, the dummy word line structure 6 may also be formed by chemical vapor deposition process.

It should be noted that since the first filling layer 331 of the first source and drain region A2 is removed, the first source and drain region A2 can be used to increase the process window, that is, to increase the reaction gas entering the word line region A1, thereby making the reaction gas relatively uniformly deposited on the surface of the active structure 2 to improve the morphology of the dummy word line structure 6.

With continued reference to FIGS. 19-21, an initial first isolation layer 50 is formed. The initial first isolation layer 50 is located in the first source-drain region A2 and the word line region A1, and covers the dummy word line structure 6 facing away from the word line region. The end face of A1 is located between adjacent dummy word line structures 6. That is to say, the reverse filling process is used to form the initial first isolation layer 50 as an isolation structure between the upper and lower word lines 62 formed subsequently.

Exemplarily, silicon oxy-carbonitride is deposited in the word line region A1 and the first source and drain region A2 by an atomic layer deposition process as the initial first isolation layer 50. The atomic layer deposition process can improve the density and uniformity of the initial first isolation layer 50, thereby improving the isolation effect, and can also improve the morphology of the subsequently formed word lines 62. In some other embodiments, the initial first isolation layer 50 may also be formed by a chemical vapor deposition process.

In some embodiments, the material of the support structure 4 is different from the material of the initial first isolation layer 50. The main reason is that part of the initial first isolation layer 50 will be removed later to form the first isolation layer 5. When removing part of the initial first isolation layer 50, in order to avoid removing the supporting structure 4, the materials of the two are different. Exemplarily, the selective etching ratio of the initial first isolation layer 50 to the support structure 4 is greater than 2.

Figure 22:
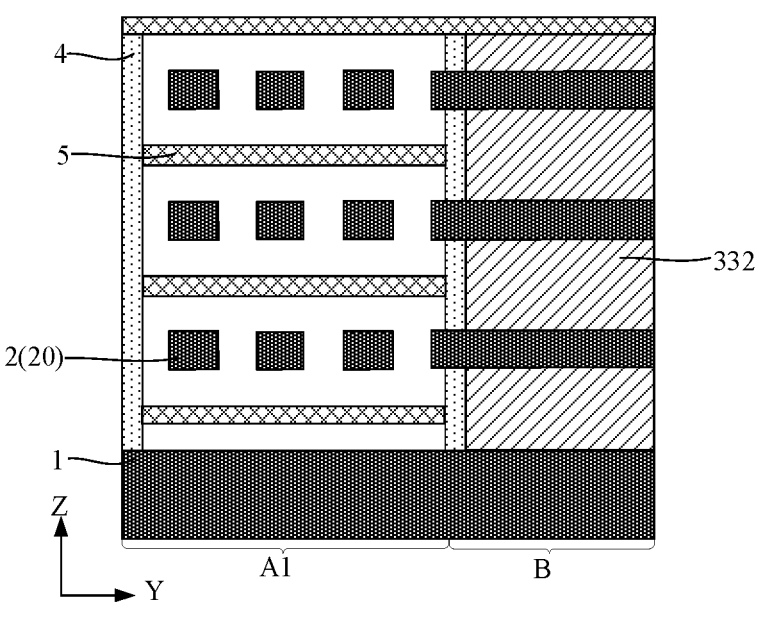
Figure 23:
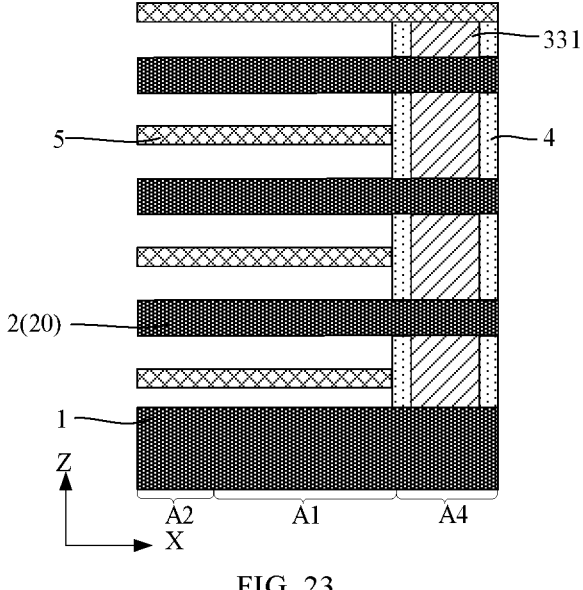
Figure 24:
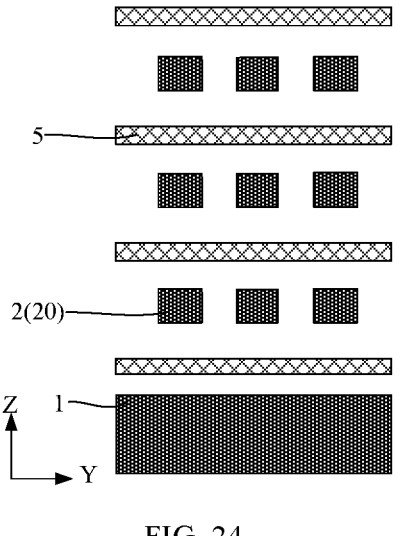

FIG. 22 is the cross sectional view on the d-d1 direction shown in FIG. 2, and FIG. 23 is the cross sectional view in the e-e1 direction shown in FIG. 2, and FIG. 24 is the cross sectional view in the f-f1 direction shown in FIG. 2 Referring to FIGS. 22-24, the initial first isolation layer 50 located on the end surface of the dummy word line structure 6 facing away from the word line region A1 is removed, and the remaining initial first isolation layer 50 is used as the first isolation layer 5. The first isolation layers 5 and the dummy word line structures 6 are arranged alternately in a third direction Z, and the third direction Z is perpendicular to the surface of the substrate 1.

Exemplarily, a dry etching process is used to remove the initial first isolation layer 50 located at the end surface of the dummy word line structure 6.

Continuing to refer to FIGS. 22-24, the dummy word line structure 6 is removed. Exemplarily, the dummy word line structure 6 is removed by a wet etching process, so as to expose the gap between adjacent first isolation layers 5.

Figure 25:
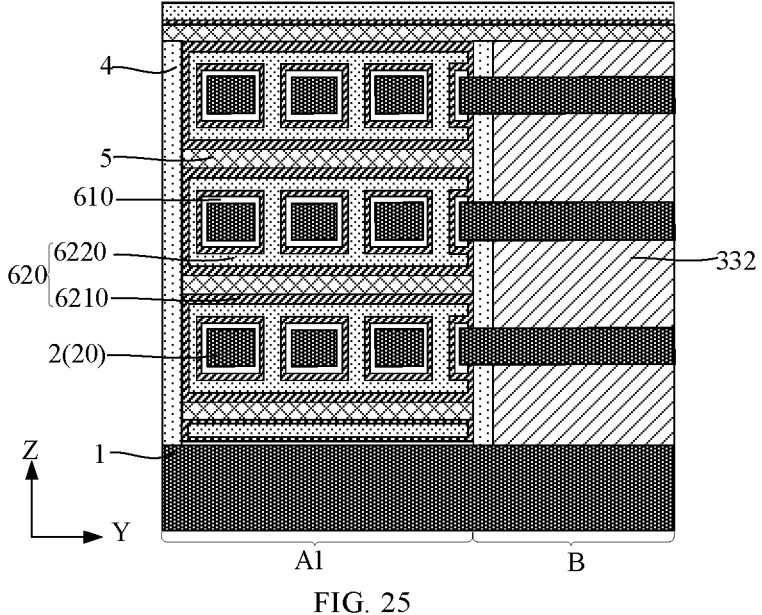
Figure 26:
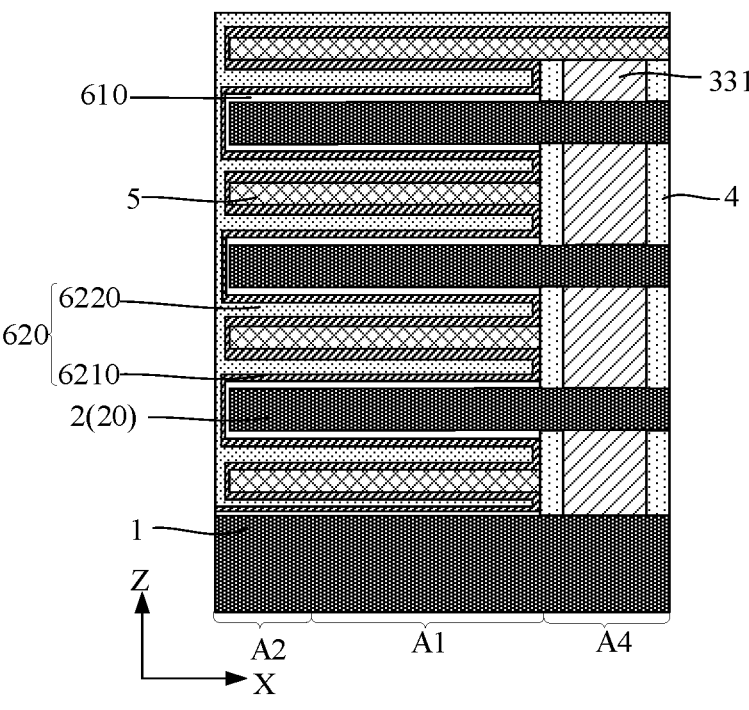
Figure 27:
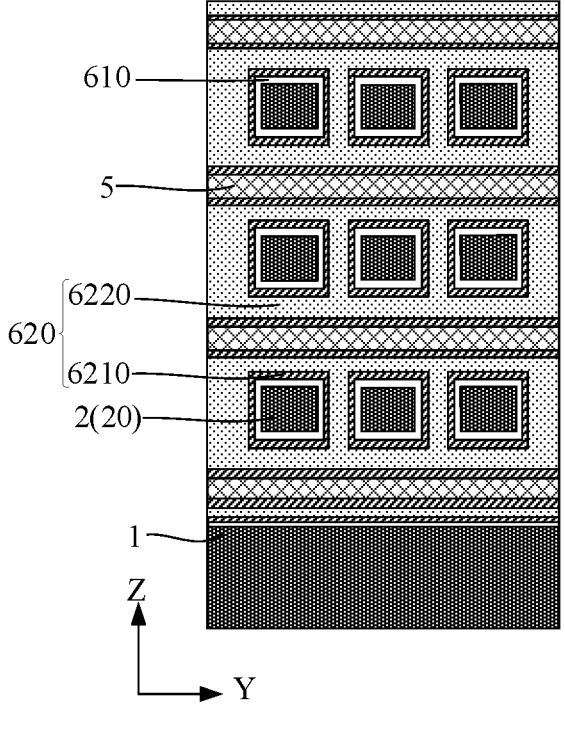

FIG. 25 is the cross sectional view on the d-d1 direction shown in FIG. 2, and FIG. 26 is the cross sectional view in the e-e1 direction shown in FIG. 2, and FIG. 27 is the cross sectional view in the f-f1 direction shown in FIG. 2 25-27, an initial dielectric layer 610 is formed on the surface of the active structure 2 in the first source and drain region A2 and the word line region A1; silicon oxide is grown as the initial dielectric layer 610.

Continuing to refer to FIGS. 25-27, an initial word line 620 is formed on the surface of the initial dielectric layer 610, and the initial word line 620 covers the active structure 2. Specifically, a film layer such as titanium nitride or tantalum nitride is formed on the surface of the initial dielectric layer 610 by an atomic layer deposition process as the initial word line barrier layer 6210. The initial word line barrier layer 6210 can prevent atomic diffusion between the subsequently formed initial word line filling layer 6220 and the first isolation layer 5, thereby ensuring that the initial word line filling layer 6220 has a low resistance.

With continued reference to FIGS. 25-27, an initial word line filling layer 6220 between adjacent first isolation layers 5 is formed. The initial word line filling layer 6220 also covers the initial word line blocking layer 6210, and the initial word line filling layer 6220 is formed. The layer 6220 covers the active structure 2 of the same layer, and the initial word line blocking layer 6210 and the initial word line filling layer 6220 form the initial word line 620. For example, a low-resistance metal such as titanium, tungsten or molybdenum is deposited between adjacent first isolation layers 5 as the initial word line filling layer 6220. The metal with low resistance is beneficial to reduce the power consumption of the semiconductor structure, and is also beneficial to shorten the delay time, thereby increasing the operating speed of the semiconductor structure.

Referring to FIG. 26, it should be noted that the initial dielectric layer 610 and the initial word line 620 are also located on the side of the first source-drain region A2 facing away from the word line region A1, and the initial word line 620 and the initial word line 620 at this position will be removed subsequently. initial dielectric layer 610.

Figure 28:
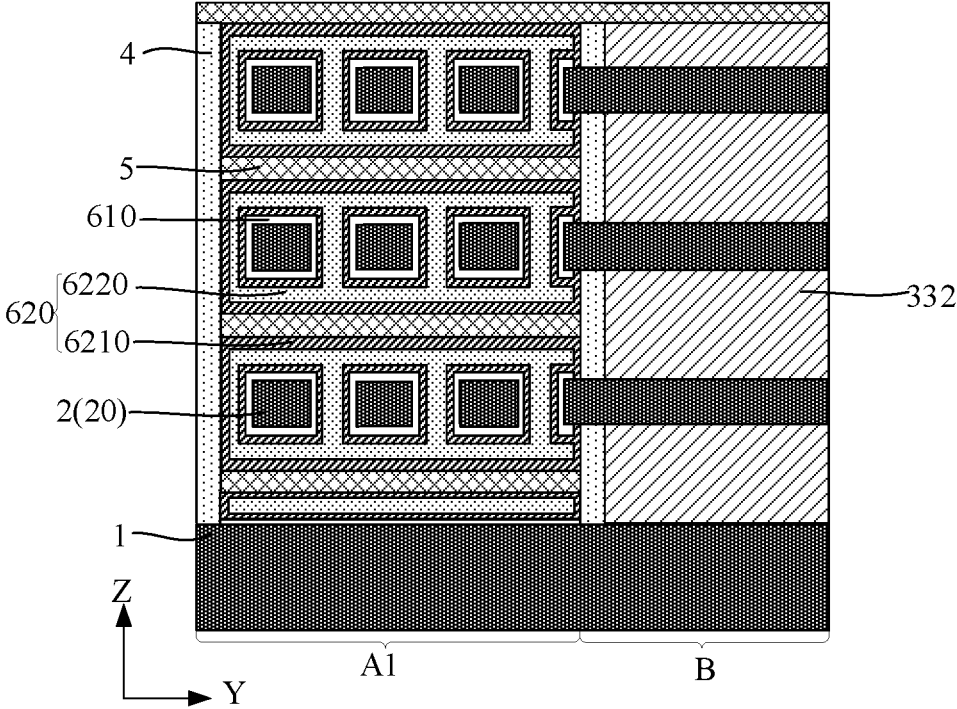
Figure 29:
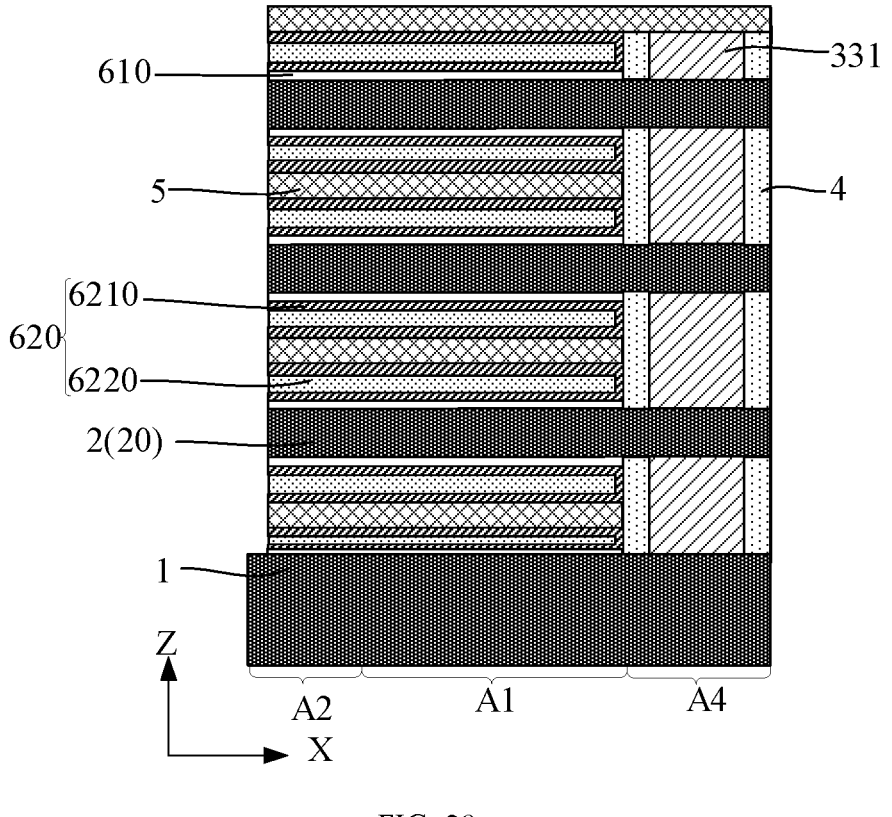

FIG. 28 is a cross sectional view in the d-d1 direction shown in FIG. 2, and FIG. 29 is a cross sectional view in the e-e1 direction shown in FIG. 2, with reference to FIG. 28-FIG. 29, remove the first isolation layer 5 Initial word lines 620 and initial dielectric layer 610 on the top surface. Specifically, the initial word line 620 and the initial dielectric layer 610 on the top surface may be removed by a chemical mechanical polishing process, so as to expose the top surface of the first isolation layer 5.

Referring to FIG. 29, the initial word line 620 and the initial dielectric layer 610 located on the side of the first source and drain region A2 facing away from the word line region A1 are etched, thereby exposing the end surface of the active structure 2.

FIG. 30 is a cross-cross sectional view of the f-f1 direction shown in FIG. 2. Referring to FIG. 30, a plurality of first trenches 501 are formed in the first source and drain region A2, and the first trenches 501 extend along the third direction Z, the third direction Z is perpendicular to the surface of the substrate 1; the first trench 501 penetrates the first isolation layer 5, the initial word line 620 and the initial dielectric layer 610.

Exemplarily, a dry etching process is used to remove the first isolation layer 5, the initial word line 620 and the initial dielectric layer 610 located between the adjacent active structures 2 along the third direction Z, thereby exposing the active structure 2 sidewalls aligned in the second direction Y.

FIG. 31 is a cross-cross sectional view along the f-f1 direction shown in FIG. 2. Referring to FIG. 31, a first insulating layer 511 filling the first trench 501 is formed. For example, silicon nitride is deposited in the first trench 501 as the first insulating layer 511. Thereafter, a chemical mechanical polishing process is used for planarization.

Figure 32:
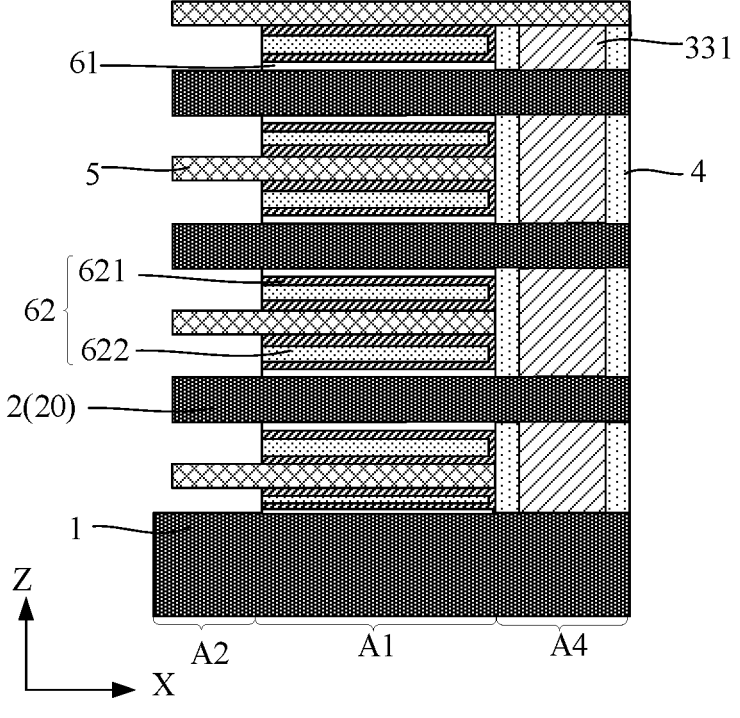
Figure 33:
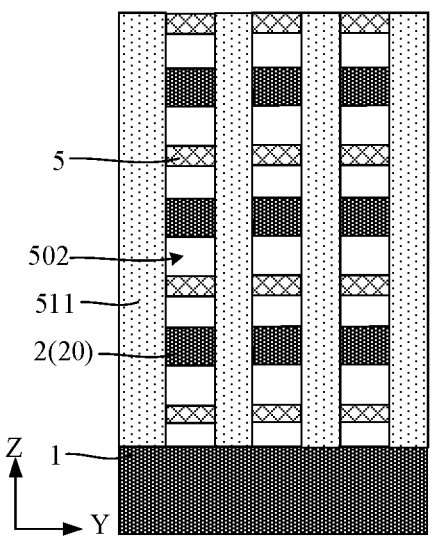

FIG. 32 is the cross sectional view of e-e1 direction shown in FIG. 2, and FIG. 33 is the cross sectional view of f-f1 direction shown in FIG. 2, with reference to FIG. 32-FIG. The original word line 620 and the initial dielectric layer 610; the remaining initial dielectric layer 610 forms the dielectric layer 61; the remaining initial word line 620 forms the word line 62. In other words, after the first insulating layer 511 is formed, the first insulating layer 511, the active structure 2 and the first isolation layer 5 enclose the small hole 502, and thereafter, the initial word line 620 and the initial word line 620 located in the small hole 502 are etched. The dielectric layer 610, so as to shorten the lengths of the initial word line 620 and the initial dielectric layer 610 in the first direction X. Because the area of the small hole 502 is small, it is easy to control the length of the initial word line 620 and the initial dielectric layer 610 to be removed, thereby avoiding the removal of the initial word line 620 and the initial dielectric layer 610 in the word line region A1. In this way, It is beneficial to improve the performance of the semiconductor structure.

So far, based on the process steps shown in FIGS. 28-30 and 32-33, the initial word line 620 and the initial dielectric layer 610 located in the first source and drain region A2 can be removed, thereby forming the word line 62 and the dielectric layer 61. The dielectric layer 61 is located on the surface of the active structure 2 in the word line region A1, and the word line 62 covers the active structure 2 in the same layer of the word line region A1 and covers the dielectric layer 61. The above steps are illustrative and not limited thereto. In some other embodiments, an etching step may also be used to remove the initial dielectric layer 610 and the initial word line 620 of the first source-drain region A2.

Figure 34:
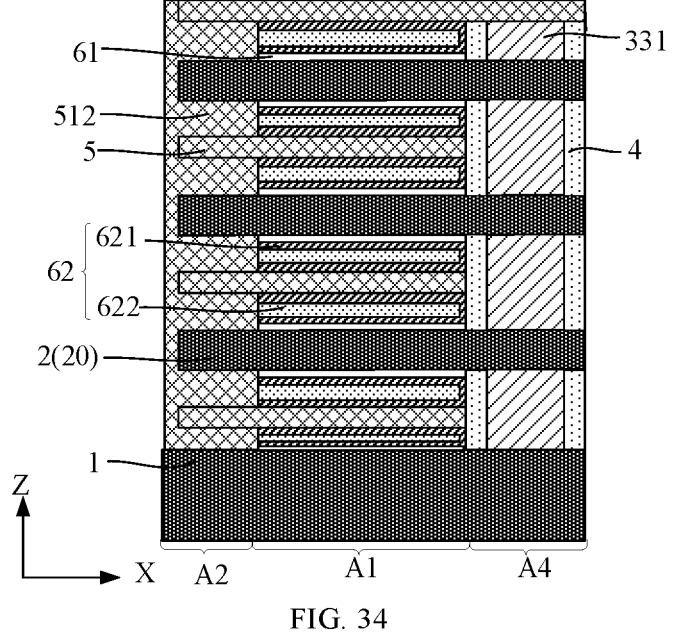
Figure 35:
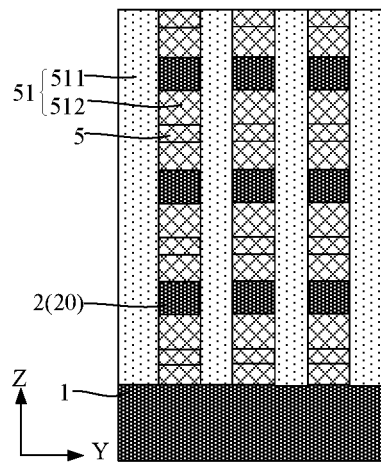

FIG. 34 is the cross sectional view of e-e1 direction shown in FIG. 2, and FIG. 35 is the cross sectional view of f-f1 direction shown in FIG. 2, with reference to FIG. 34-FIG. 35, in the first source-drain region A2 forms the second insulating layer 512, the second insulating layer 512 is located on the upper and lower sides of the active structure 2 and near the adjacent first insulating layer 511, and also covers the first insulating layer 5; the first insulating layer 511 and the second insulating layer 512 form an insulating layer 51. In other words, the second insulating layer 512 is located in the small hole 502 surrounded by the first insulating layer 511, the active structure 2 and the first isolation layer 5, and covers the sidewall of the first source-drain region A2 away from the word line region A1.

Exemplarily, silicon carbon nitride is deposited in the first source and drain region A2 as the second insulating layer 512. The material of the second insulating layer 512 may be the same as that of the first isolation layer 5.

So far, based on the two steps shown in FIG. 31 and FIGS. 34-35, an insulating layer 51 can be formed in the first source-drain region A2. The insulating layer 51 is located between adjacent active structures 2 and covers the first Isolation layer 5. Forming the insulating layer 51 in two steps is beneficial to improving the density of the insulating layer 51, thereby improving the isolation effect of the insulating layer 51. In some other embodiments, after removing the initial dielectric layer 610 and the initial word line 620 of the first source-drain region A2, the insulating layer 51 may be formed by one deposition step.

It should be noted that, before forming the second insulating layer 512, the manufacturing method further includes: performing heavy doping treatment on the active structure 2 of the first source and drain region A2. For example, the type of doping ions in the first source-drain region A2 may be opposite to the type of doping ions in the word line region A1.

Figures 36, 37:
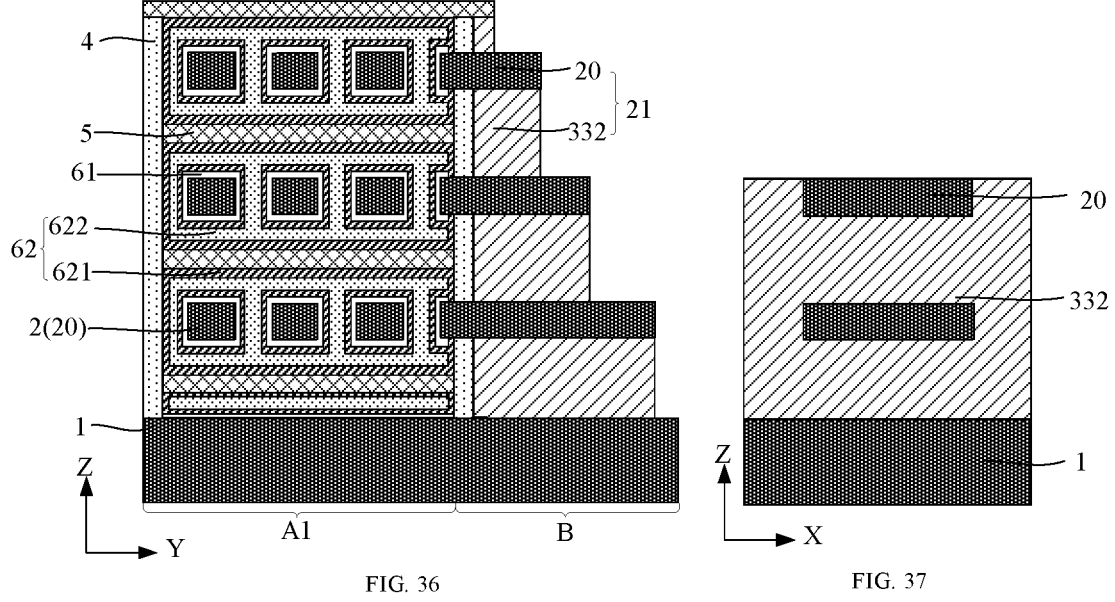

FIG. 36 is the cross sectional view of the d-d1 direction shown in FIG. 2, and FIG. 37 is the cross sectional view of the g-g1 direction shown in FIG. 2, with reference to FIG. 36-FIG. 37, step region B is carried out graphical processing, to form a plurality of steps 21, the steps 21 include the active layer 20 and the second filling layer 332 thereunder.

Exemplarily, a part of the active layer 20 and a part of the second filling layer 332 are removed by a dry etching process, and the remaining active layer 20 and the second filling layer 332 are used as the step 21.

Figure 38:
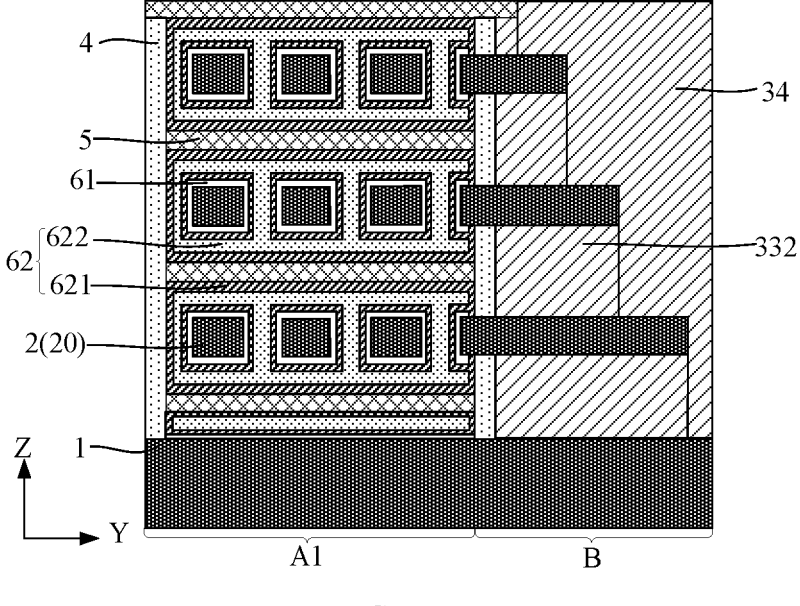
Figure 39:
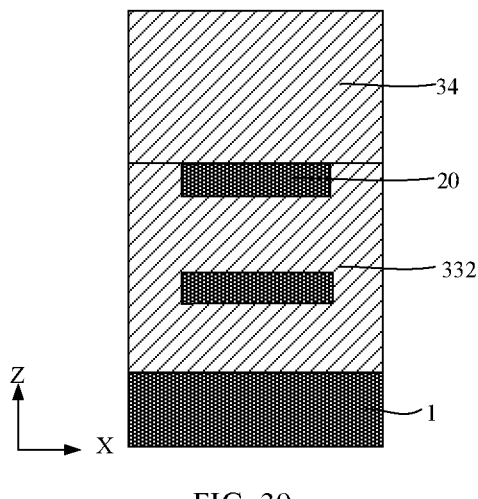

FIG. 38 is the cross sectional view of the d-d1 direction shown in FIG. 2, and FIG. 39 is the cross sectional view of the g-g1 direction shown in FIG. 2, with reference to FIG. 38-FIG. 39, forms the first covering layer of covering step 34. For example, the material of the first covering layer 34 may be the same as that of the second filling layer 332, for example, silicon oxide is deposited on the steps as the first covering layer 34.

Figure 40:
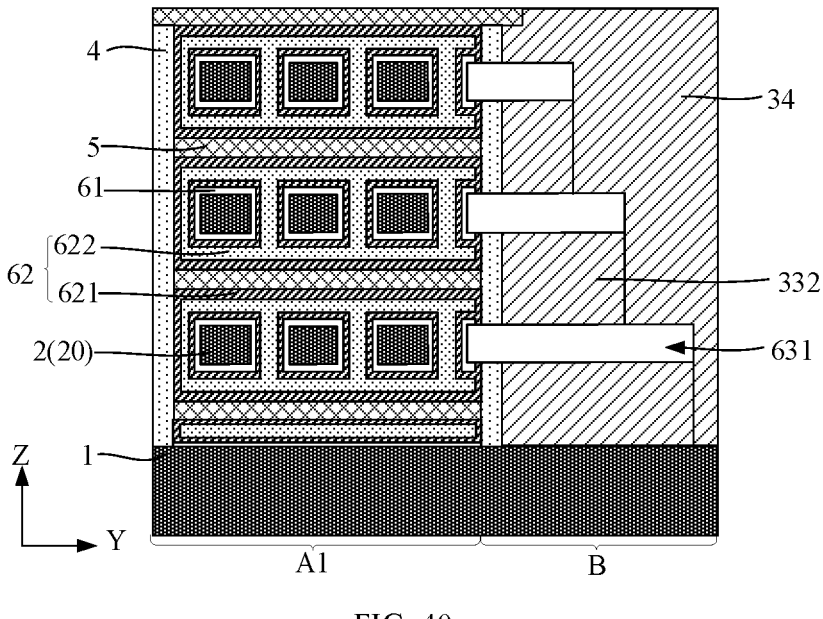
Figure 41:
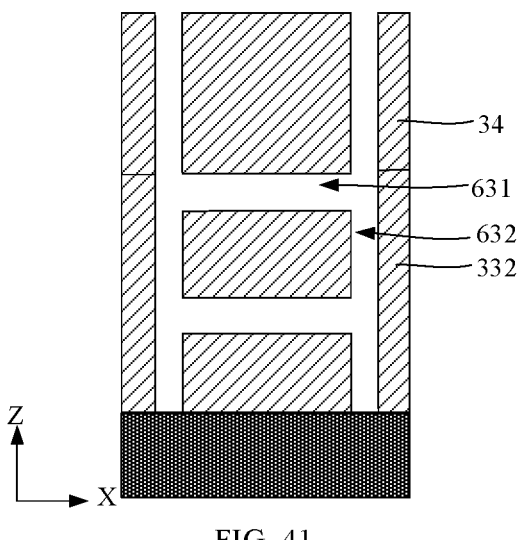

FIG. 40 is the cross sectional view of the d-d1 direction shown in FIG. 2, and FIG. 41 is the cross sectional view of the g-g1 direction shown in FIG. 2, with reference to FIG. 40-FIG. 41, after forming the first covering layer 34, Form a second trench 632 in the second region B2, the second trench 632 is located on opposite sides of the active layer 20 arranged in the first direction X, and exposes the sidewall of the active layer 20; remove the first region B1 active layer 20 to form step-filled grooves 631.

That is to say, the purpose of forming the second trench 632 is to expose the active layer 20, so that the etchant can enter under the first cladding layer 34 through the second trench 632, thereby contacting the active layer 20. reaction, and finally the active layer 20 is removed. The position of the step-filled groove 631 is the position of the original source layer 20.

In some other embodiments, after removing the active layer 20 to form the step filling groove 631, the dielectric layer 61 connected to the active layer 20 can be removed through the step filling groove 631, that is, the word line region A1 and the step region are removed from the dielectric layer 61 at the junction of B, so that the subsequently filled word line connection layer 63 can directly contact with the word line 62, increasing the contact area and reducing the contact resistance.

So far, based on the steps shown in FIG. 36-FIG. 41, the active layer 20 located in the step region B word line region A1 can be removed. It should be noted that the advantage of using two steps to remove the active layer 20 is that the length of the active layer 20 in the second direction Y can be shortened, thereby reducing residues generated by etching the active layer 20. In addition, when the step 21 is formed, the length of the second filling layer 332 in the second direction Y is correspondingly shortened, which can avoid the subsequent tilting or collapse of the second filling layer 332 due to loss of support after the active layer 20 is removed. question.

Figure 42:
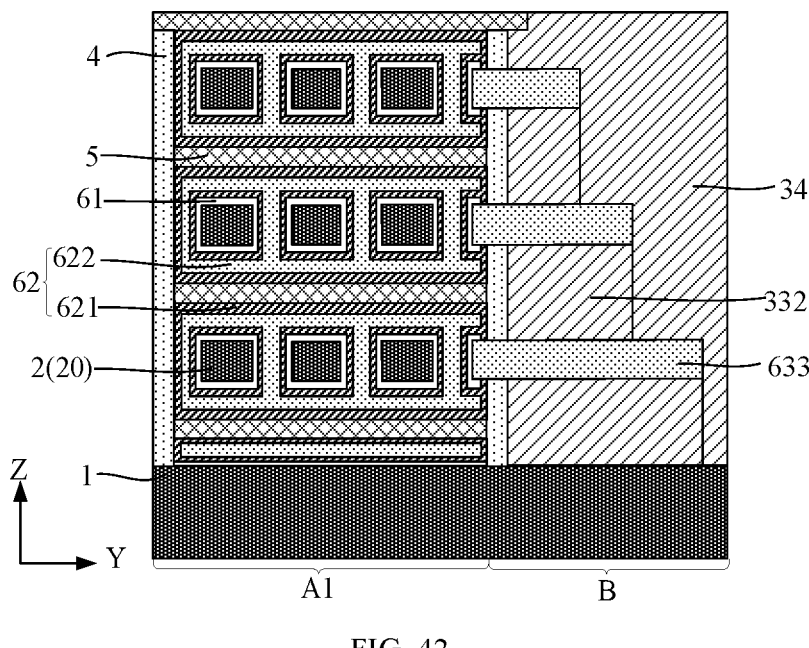

FIG. 42 is the cross sectional view of d-d1 direction shown in FIG. 2, and FIG. 43 is the cross sectional view of g-g1 direction shown in FIG. 2, with reference to FIG. 42-FIG. An initial word line connection layer 633 is formed in the trench 632. The material of the initial word line connection layer 633 can be low resistance metal, such as copper, tungsten, molybdenum or aluminum and so on.

Referring to FIG. 44, FIG. 44 is a cross-cross sectional view of the g-g1 direction shown in FIG. 2, the initial word line connection layer 633 located in the second trench 632 is removed, and it is located in the step-filled groove 631 (refer to FIG. 41). The initial word line connection layer 633 serves as the word line connection layer 63, and the word line connection layer 63 is also located between adjacent second filling layers 332. The word line connection layer 63 is electrically connected to the word line 62.

It should be noted that the word line connection layer 63 in the step region B replaces the active layer 20 as the contact structure of the word line 62, and the resistance of the word line connection layer 63 is smaller than the resistance of the active layer 20, which can improve the semiconductor resistance. The operating speed of the structure is reduced, and the power consumption of the semiconductor structure is reduced. In addition, when the active layer 20 is removed, a larger opening can be formed at the junction of the step region B and the word line region A1, thereby increasing the contact area between the word line 62 and the word line connection layer 63, thereby reducing the contact resistance.

Continuing to refer to FIG. 44, the third isolation layer 35 is formed in the second trench 632 (refer to FIG. 41). The material of the third isolation layer 35 may be the same as that of the first covering layer 34 and the second filling layer 332, such as silicon dioxide.

Figure 45:
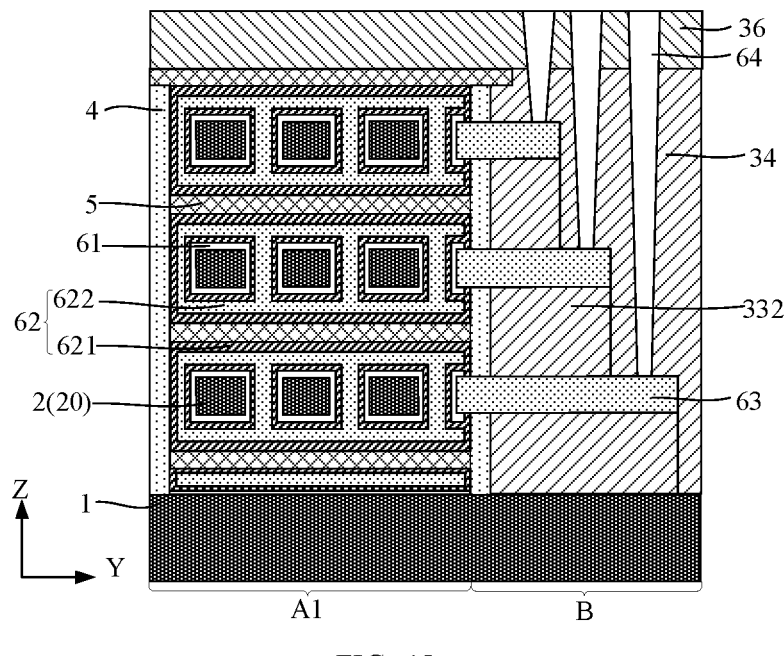
Figure 46:
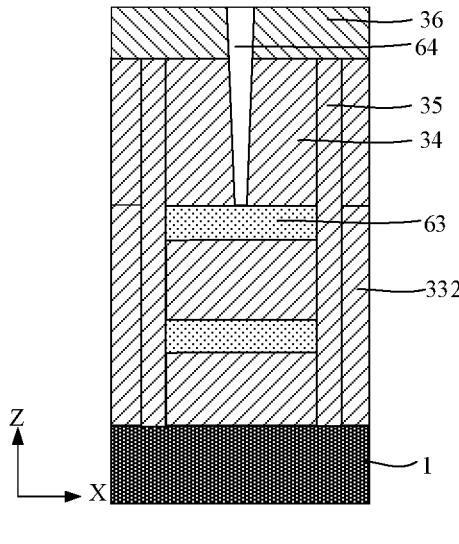

With reference to FIGS. 45-46, a plurality of connecting pillars 64 are formed, and the connecting pillars 64 correspond to the steps one by one, and penetrate the first covering layer 34 on the word line 62, so that the connecting pillars 64 and the word line 62 connect.

Exemplarily, a second covering layer 36 is formed on the first covering layer 34, a contact hole penetrating through the first covering layer 34 and the second covering layer 36 is formed, and the word line connecting layer 63 of the contact hole and the step region B One-to-one correspondence, and the top surface of the word line connection layer 63 is exposed. Conductive material is deposited within the contact holes as connection pillars 64.

In addition, with reference to FIG. 2, transistor area A also comprises anti-leakage area A4 and the second source-drain area A5; anti-leakage area A4 is positioned between the second source-drain area A5 and the word line region A1; In the first direction X Above, the width of the anti-leakage region A4 is greater than the width of the second source-drain region A5; the active structure 2 of the anti-leakage region A4 is lightly doped; the active structure 2 of the second source-drain region A5 is heavily doped deal with.

Specifically, the purpose of lightly doping the anti-leakage region A4 is to slowly change the potential, reduce the transition probability, and then reduce the gate-induced drain leakage current GIDL (gate-induced drain leakage), thereby improving the semiconductor structure reliability. The doping type of the second source-drain region A5 may be the same as that of the anti-leakage region A4 and the first source-drain region A2.

In addition, referring to FIG. 2, the transistor region A may further include a bit line region A3, and the bit line region A3 is connected to the first source-drain region A2. A bit line 7 extending along the third direction Z may be formed in the bit line region A3, and the bit line 7 is connected to the multi-layer active structure 2.

In addition, referring to FIG. 2, the semiconductor structure may further include a capacitor region C, which is connected to the second source-drain region A5, and a plurality of stacked capacitors may be formed in the capacitor region C.

In summary, in the embodiment of the present disclosure, the dummy word line structure 6 is first formed on the surface of the active structure 2; form the first isolation layer 5, remove the dummy word line and get a pattern for the word line 62; filling conductive material in the first isolation layer 5 and form the word line 62, thereby avoiding the disconnection of the word line 62 in the same layer, or avoiding the interconnection issues between the upper and lower layers in word lines 62. In addition, since the active layer 20 of the step region B is removed, the opening at the junction of the word line region A1 and the step region B is larger, thereby avoiding the disconnection of the word line 62 at the junction of the two regions. In addition, removing the first filling layer 331 in the first source-drain region A2 can increase the process window of the word line region A1. In addition, the first insulating layer 511 is formed, and the first insulating layer 511, the active structure 2 and the first isolation layer 5 can form a small hole 502, which can facilitate the control of the length of the removed initial word line 620. In this way, it is beneficial to improve the performance of the semiconductor structure. In addition, since the method of forming the first isolation layer 5 includes the atomic layer deposition process, and the method of forming the dummy word line structure includes the atomic layer deposition process, it can ensure that the finally formed word line 62 have a good shape.

The invention claimed is:

1. A method for manufacturing a semiconductor structure, wherein the semiconductor structure comprises a transistor region, wherein the transistor region comprises a first source-drain region arranged in a first direction and a word line region, wherein the method comprises:

providing a substrate; forming multiple active layers at intervals on the substrate, wherein the active layers of the transistor region comprises a plurality of active structures arranged in a second direction, wherein the second direction is perpendicular to said first direction forming a plurality of dummy word line structures in the first source-drain region and the word line region, wherein the plurality of the dummy word line structures cover the surface of the plurality of active structures on a same layer;

forming a first isolation layer, wherein the first isolation layer and the plurality of dummy word line structures are arranged alternately in a third direction, wherein the third direction is perpendicular to the surface of the substrate;

removing the plurality of dummy word line structures;

forming an initial dielectric layer on a surface of the plurality of active structures of the first source-drain region and the word line region;

forming an initial word line on a surface of the initial dielectric layer, wherein the initial word line covers the plurality of the active structures;

removing the initial word line and the initial dielectric layer located in the first source-drain region, wherein a remaining initial dielectric layer forms a dielectric layer, wherein a remaining initial word line forms a word line, wherein the word line covers the plurality of active structures on the same layer in the word line region; and forming an insulating layer in the first source-drain region, wherein the insulating layer is disposed between two adjacent ones of the plurality of active structures and covers the first isolation layer.

2. The method for manufacturing the semiconductor structure according to claim 1, wherein the removing the initial word line and initial dielectric layer located in the first source-drain region, and forming the insulating layer in the first source-drain region comprising:

forming a plurality of first trenches in the first source-drain region, wherein the plurality of first trenches extend along the third direction, wherein the third direction is perpendicular to the surface of the substrate; wherein the plurality of first trenches penetrates the first isolation layer, the initial word line and the initial dielectric layer;

forming a first insulating layer filling the plurality of first trenches;

after forming the first insulating layer, removing the initial word line and the initial dielectric layer remaining in the first source and drain region; and forming a second insulating layer in the first source and drain region, wherein the second insulating layer is located on upper and lower sides of the plurality of active structures and adjacent to the first insulating layer, wherein the first isolation 1 layer is covered, wherein the first insulating layer and the second insulating layer constitute the insulating layer.

3. The method for manufacturing the semiconductor structure according to claim 2, wherein the initial dielectric layer and the initial word line are also located at an opposite side, one side of the word line region in the first source-drain region; and wherein before forming the plurality of first trenches, the method further comprises: etching the initial word line on a side of the first source and drain region facing away from the word line region and the initial dielectric layer.

4. The method for manufacturing the semiconductor structure according to claim 2, further comprising: before forming the second insulating layer: doping heavily in the plurality of active structures of the first source and drain region.

5. The method for manufacturing the semiconductor structure according to claim 1, wherein a step of forming active layers (20) with multiple layers arranged at intervals comprises:

forming multiple layers of alternately arranged sacrificial layers and the active layer on the substrate;

forming a second isolation layer in the transistor region, wherein the second isolation layer penetrates the active layers and the sacrificial layers, and the active layers of the transistor region are divided into the plurality of the active structures;

after forming the second isolation layer, the method further comprises:

forming a support structure, wherein the support structure is at least located on a side of the word line region facing away from the first source and drain region, wherein the support structure covers the plurality of the active structures;

removing, after forming the support structure, the second isolation layer and the sacrificial layers, forming a first filling layer in the transistor region, wherein the first filling layer covers the active layers and the support structure; and before forming the plurality of dummy word line structures, the method further comprises: removing the first filling layer located in the first source-drain region and the word line region.

6. The method for manufacturing the semiconductor structure according to claim 5, wherein a material of the support structure is different from a material of the first isolation layer.

7. The method for manufacturing the semiconductor structure according to claim 6, wherein the semiconductor structure further comprises: a step region, wherein the step region and the word line region are connected and arranged in the second direction;

wherein the method further comprises: forming multiple second filling layers in the step region, wherein the second filling layers are arranged alternately with the active layers;

removing the active layers from the step region;

forming a word line connection layer between adjacent two of the second filling layers, wherein the word line connection layer is electrically connected to the word line.

8. The method for manufacturing the semiconductor structure according to claim 7, wherein the step region comprises a first region and a second region, wherein the first region is opposite to the word line region, and a side of the first region is in contact with the word line region, and wherein the second region surrounds another side of the first region that is not in contact with the word line region;

before forming the second filling layers, the method further comprises:

forming the multiple sacrificial layer on the substrate in the step region, and the sacrificial layers are arranged alternately with the active layers;

removing the sacrificial layers and the active layers from in the second region;

forming an edge isolation layer in said second region;

forming a frame structure surrounding the step region, the frame structure penetrates the edge isolation layer, and is between the step region and the first region Where connected, the frame structure also covers the active layers;

removing the edge isolation layer and the sacrificial layers from in the first region; and forming the second filling layers, wherein the second filling layers is arranged alternately with the active layers of the first region.

9. The method of manufacturing the semiconductor structure according to claim 7, wherein in the first direction, a width of the step region is larger than a width of the word line region.

10. The method for manufacturing the semiconductor structure according to claim 8, wherein a step of forming the word line connection layer comprises:

patterning the step region to form multiple steps, wherein the steps comprise the active layers and the second filling layers below the active layers; wherein the word line region points to a direction along a long side of the step region, and a height of the steps decreases successively;

forming a first covering layer covering the steps;

forming a second trench in the second region after the first covering layer is formed, wherein the second trench is located in the active layers, wherein opposite sides are arranged in the first direction and expose sidewalls of the active layers;

removing the active layers of the first region to form step-filled grooves;

forming an initial word line connection layer in the step-filled grooves and the second trench;

removing the initial word line connection layer (633) located in the second trench, wherein the initial word line connection layer located in the step-filled groove constitutes as the word line connection layer; and forming a third isolation layer in the second trench.

11. The method for manufacturing the semiconductor structure according to claim 10, further comprising:

forming a plurality of connecting pillars, wherein the plurality of connecting pillars forms a one by one correspondence to the steps and penetrates through the first covering layer on the word line, to connect to the plurality of connecting pillars with the word line.

12. The method for manufacturing the semiconductor structure according to claim 1, wherein forming the first isolation layer (5) comprises:

forming an initial first isolation layer, wherein the initial first isolation layer (50) is located in the first source and drain region and the word line region (A1), wherein the initial first isolation layer covers end faces of the plurality of dummy word line structures facing away from the word line region, and located between adjacent two of the plurality of dummy word line structures; and removing the initial first isolation layer from the end faces of the plurality of dummy word line structures, wherein a portion of the initial first isolation layer remaining after the removal constitutes as the first isolation layer.

13. The method for manufacturing the semiconductor structure according to claim 1, wherein the transistor region further comprises an anti-leakage region and a second source-drain region, wherein the anti-leakage area is located between the second source-drain area and the word line region; and wherein in the first direction, a width of the anti-leakage area is greater than a width of the second source and drain region;

wherein the method further comprises:

performing light doping treatment on the plurality of active structures of the anti-leakage region; and doping heavily in the plurality of active structures of the second source and drain region.

14. The method for manufacturing the semiconductor structure according to claim 1, wherein a technique of forming the plurality of the dummy word line structures comprises an atomic layer deposition process.

15. The method for manufacturing the semiconductor structure according to claim 1, wherein the technique for forming the first isolation layer comprises an atomic layer deposition process.

\* \* \* \* \*